(12) United States Patent
Mukai et al.

(10) Patent No.: US 8,302,838 B2
(45) Date of Patent: Nov. 6, 2012

(54) MICRO-BUMP FORMING APPARATUS

(75) Inventors: Noriaki Mukai, Toride (JP); Isao Abe, Katori (JP)

(73) Assignee: Hitachi Plant Technologies, Ltd., Tokyo (JP)

( * ) Notice: Subject to any disclaimer, the term of this patent is extended or adjusted under 35 U.S.C. 154(b) by 0 days.

(21) Appl. No.: 13/111,252

(22) Filed: May 19, 2011

(65) Prior Publication Data

US 2011/0284618 A1  Nov. 24, 2011

(30) Foreign Application Priority Data

May 24, 2010  (JP) .................................. 2010-118426

(51) Int. Cl.
*B23K 3/00* (2006.01)
(52) U.S. Cl. .............................. 228/41; 228/9; 228/245
(58) Field of Classification Search ................ 228/9, 41, 228/245
See application file for complete search history.

(56) References Cited

U.S. PATENT DOCUMENTS 5,768,775 A * 6/1998 Nakazato ........................ 29/843
6,417,089 B1 * 7/2002 Kim et al. ..................... 438/612

FOREIGN PATENT DOCUMENTS

| JP | 04-186791 | 7/1992 |
| JP | 2004-186286 | 7/2004 |
| JP | 2008-142775 | 6/2008 |

* cited by examiner

*Primary Examiner* — Nicholas D'Aniello
(74) *Attorney, Agent, or Firm* — Antonelli, Terry, Stout & Kraus, LLP.

(57) ABSTRACT

A micro-bump forming apparatus includes: a film attachment mechanism that attaches a film on a surface of a substrate; exposure and developing mechanisms that provide openings in the film on electrodes formed on the substrate; a solder ball loading mechanism that loads solder balls into the openings, a flux printing mechanism that prints flux through the openings loaded with the solder balls; a reflow part that heats the solder balls to form solder bumps; and a film detachment mechanism that detaches the film from the surface of the substrate. After a loading head loads the solder balls into the openings of the film, a controller of the solder ball loading mechanism allows a line sensor to operate to check a loading state of the solder balls, and determines, based on the check result, whether to reload the solder balls.

11 Claims, 4 Drawing Sheets

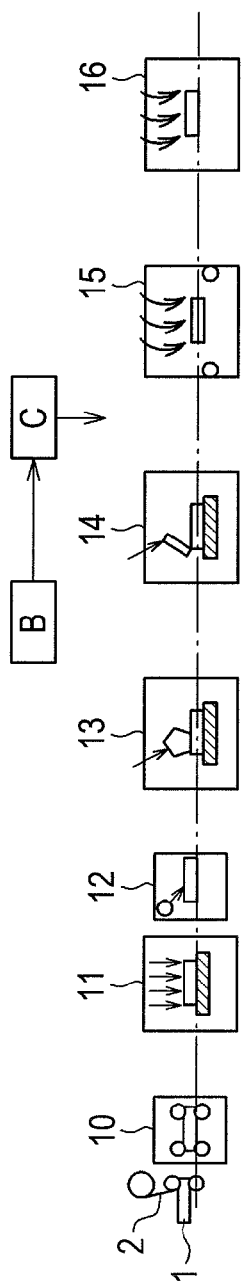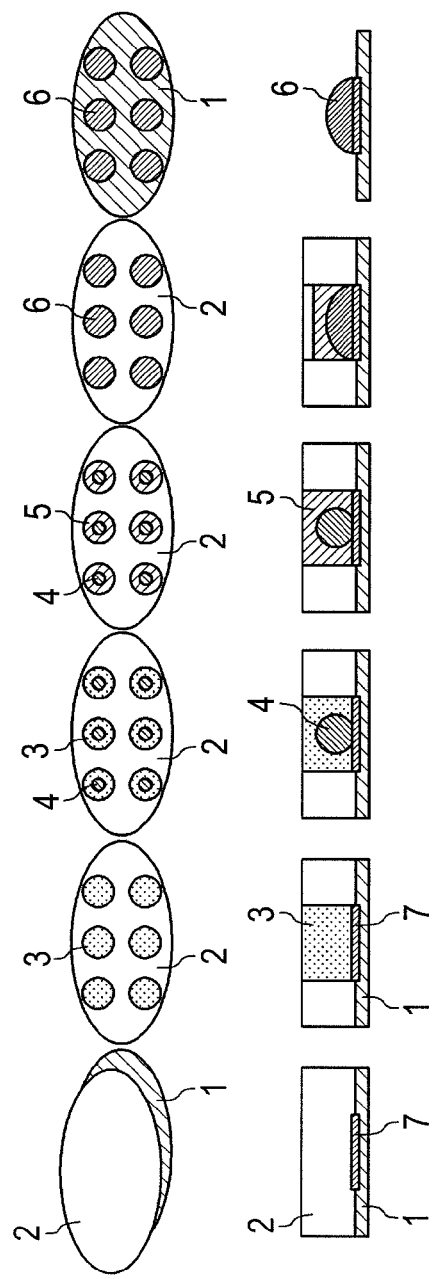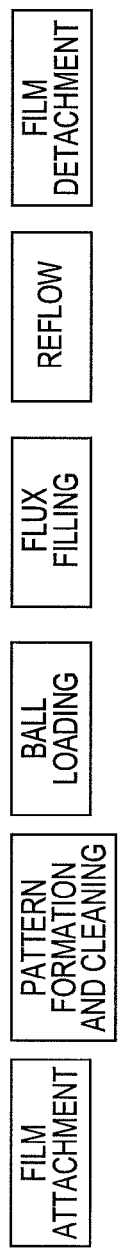
FIG. 1A
FIG. 1B
FIG. 1C

MICRO-BUMP FORMING APPARATUS

BACKGROUND OF THE INVENTION

1. Field of the Invention

The present invention relates to a printer for forming solder on electrodes of a semiconductor substrate by a printing method, and more particularly, to a micro-bump forming apparatus for printing using micro solder balls.

2. Description of the Related Art

In related art solder ball printers, as disclosed in Japanese Published Unexamined Patent Application No. 2004-186286, by a screen printing method, flux is applied to electrodes on a substrate surface, and solder balls are disposed thereon. The solder balls are then melted by reflow and fused on the electrodes.

Further, as disclosed in Japanese Published Unexamined Patent Application No. 2008-142775, in a structure in which solder balls are charged into mask openings by horizontally moving a squeegee head while rotating the same, a predetermined number of solder balls are fed to a rotating shaft of the squeegee head from a dispensing portion provided at an upper portion of the squeegee head, and the solder balls are fed from the rotating shaft onto a mask surface. In addition, Japanese Published Unexamined Patent Application No. 4-186791 discloses a structure in which a mask is made of a film, and solder in paste form is printed.

In recent years, the size of electrodes to be printed has become smaller, and also the size of solder balls used for printing has become smaller, in the range of 10 μm to 70 μm, relative to traditional solder balls having a size in the range of 80 μm to 150 μm. In response to this, it is necessary to reduce the size of the mask openings through which the solder balls are fed to a substrate. However, the known metal masks do not permit the formation of such small openings. Therefore, when solder balls are printed through large openings, the balls are likely to be moved off center with respect to the electrodes. As a result, there have been many cases of print failure being judged. In particular, in the case, as disclosed in Japanese Published Unexamined Patent Application No. 2004-186286, where flux is applied to electrodes, and then solder balls are mounted thereon, the adhesive force of the flux makes it impossible to correct the misaligned balls, resulting in the increase in print failure.

Further, in the method of feeding the solder balls onto the mask surface from the rotating shaft as disclosed in Japanese Published Unexamined Patent Application No. 2008-142775, the solder balls are dispersed on the mask surface along with the rotation of the squeegee head. Therefore, there is a problem that the solder balls cannot be always uniformly dispersed and arranged, causing print defects. Additionally, in Japanese Published Unexamined Patent Application No. 4-186791 having the structure in which the paste solder is printed using the film mask, the film is thin, having a thickness of 10 μm, and therefore cannot be applied to the solder balls having a diameter in the range of 10 μm to 70 μm.

SUMMARY OF THE INVENTION

Accordingly, an object of the present invention is to provide a small sized solder bump forming apparatus for printing solder balls with a high degree of accuracy.

In order to achieve the above-mentioned object, according to an aspect of the present invention, a micro-bump forming apparatus in which solder balls are loaded into openings of a film attached on a substrate, and heated to form solder bumps, includes:

a film attachment mechanism that attaches the film on a surface of the substrate; exposure and developing mechanisms that provide the openings in the film on electrodes formed on the substrate; a solder ball loading mechanism that loads the solder balls into the openings; a flux printing mechanism that prints flux through the openings loaded with the solder balls; a reflow part that heats the solder balls to form the solder bumps; a film detachment mechanism that detaches the film from the surface of the substrate; and a controller that controls operations of the respective mechanisms. The solder ball loading mechanism includes a solder ball loading head, and a sensor for checking a loading state. After the loading head loads the solder balls into the openings of the film, the controller of the solder ball loading mechanism allows the sensor to operate to check the loading state of the solder balls, and determines, based on the check result, whether to reload the solder balls.

Preferably, the solder ball loading mechanism further includes: a loading table; a substrate mounting portion for mounting the substrate to be printed. The substrate mounting portion may have a surface formed in a raised manner relative to that of the loading table. Also, the solder ball loading mechanism may include a mask for covering the surfaces of the loading table and the substrate mounting portion. Further, the arrangement may be such that the solder ball loading head includes a dispersing squeegee, and the dispersing squeegee moves while being pressed on surfaces of the mask and the film attached on the surface of the substrate with a predetermined pressing force to thereby load the solder balls into the openings of the film.

Preferably, the mask includes: a plurality of openings between the surfaces of the loading table and the substrate mounting portion; and a feed pipe for feeding positive pressure. The feed pipe may be connected to the plurality of openings. Also, the arrangement may be such that, after the loading of the solder balls into the openings of film, the controller feeds positive pressure into the feed pipe to allow the solder balls remaining on the periphery of the substrate to move on the mask.

Preferably, the micro-bump forming apparatus further includes a printing cover provided above the loading table for covering the whole surfaces of the loading table and the substrate mounting portion. The solder ball loading head, the sensor, and an air-spray nozzle may be provided within the printing cover through a driving mechanism composed of a driving motor and a ball screw that allow the solder ball loading head, the sensor, and the air-spray nozzle to move horizontally. Also, the arrangement may be such that the printing cover includes a ceiling portion having an exhaust port, and the exhaust port is connected to a discharge pump for maintaining a constant environmental condition in the printing cover.

Preferably, the solder balls have a diameter in the range of about 20 μm to 70 μm.

Preferably, the flux printing mechanism includes: a substrate mounting portion with a heater, for mounting the substrate loaded with the solder balls; and a squeegee for printing flux on the substrate. The arrangement may be such that the controller of the flux printing mechanism controls the heater to keep the substrate at a constant temperature and allows the squeegee to move horizontally while pressing the squeegee against the substrate with a predetermined pressing force to thereby perform flux printing.

Preferably, the solder ball loading mechanism includes a loading table, and a substrate mounting portion for mounting the substrate to be printed, which are separately provided. The arrangement may be such that the loading table has a ball receiving groove, and, after the loading of the solder balls into the openings of the film, the loading table is oscillated to thereby collect the solder balls remaining on the loading table in the ball receiving groove.

With the foregoing structure, the solder bumps can be formed by using the solder balls having a very small diameter in the range of 10 μm to 70 μm. In addition, the excess micro-balls, which are not used for printing, can be used for the next solder ball printing, thereby allowing a reduction in cost of materials.

BRIEF DESCRIPTION OF THE DRAWINGS

FIGS. 1A to 1C show the configuration of a solder bump forming apparatus and the operation of each step of a solder bump forming process according to one embodiment of the present invention;

DESCRIPTION OF THE PREFERRED EMBODIMENTS

Figure 2:
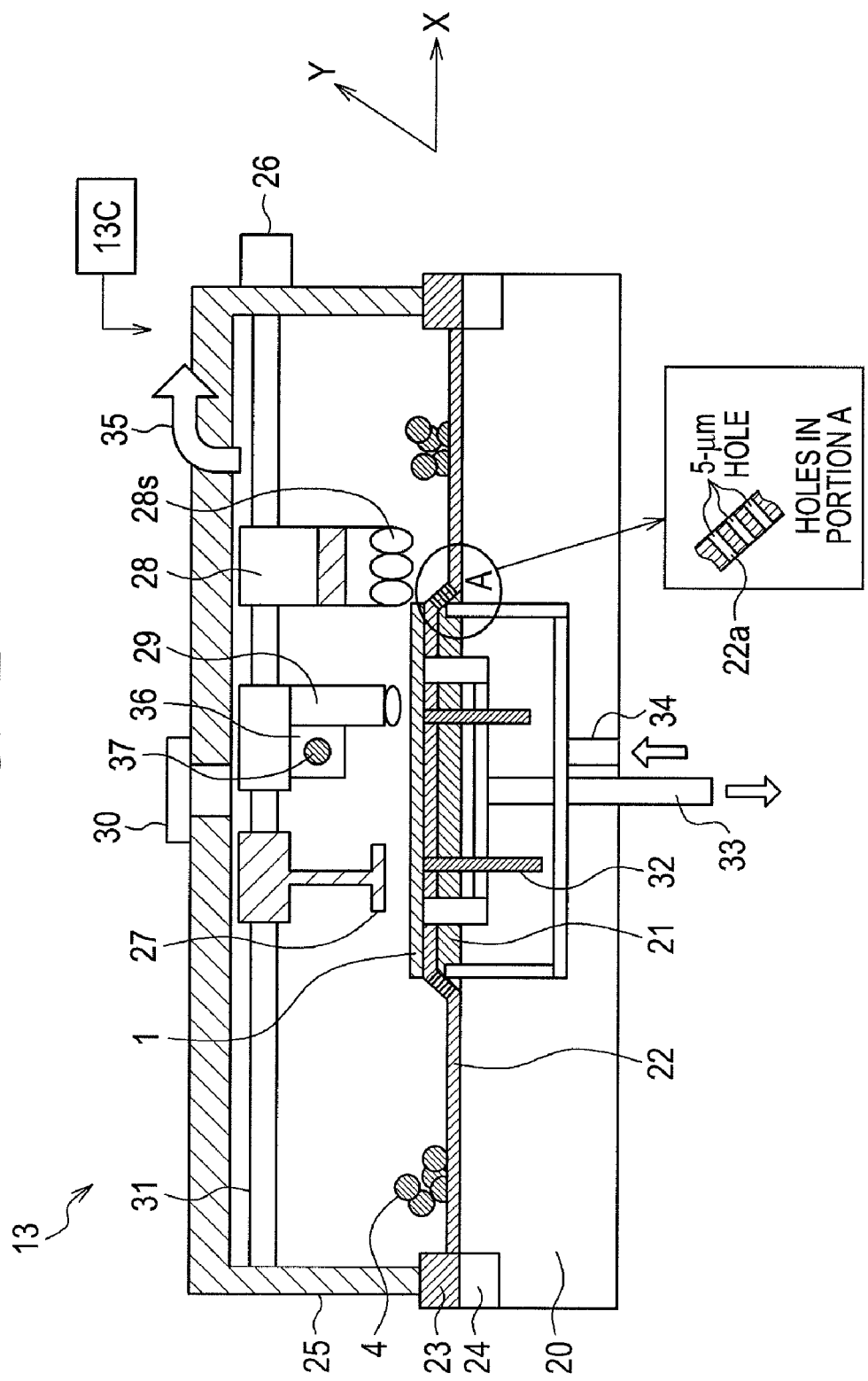
FIG. 2 shows the configuration of a solder ball loading mechanism according to one embodiment of the present invention.

Hereinafter, one embodiment of the present invention will be described with reference to the accompanying drawings. FIGS. 1A to 1C show the general configuration of a solder bump forming apparatus and a solder bump forming process according to one embodiment of the present invention. FIG. 1A illustrates respective mechanisms that make up the solder bump forming apparatus, and a solder bump forming process step in each of the mechanisms; FIG. 1B shows a state of a substrate in each step; and FIG. 1C is a sectional view of the substrate in each state shown in FIG. 1B.

The solder bump forming apparatus is composed of a film attachment mechanism 10, an exposure mechanism 11, a developing mechanism 12, a solder ball loading mechanism 13, a flux printing mechanism 14, a reflow part 15, and a film detachment mechanism 16, which are disposed in the conveying direction of a substrate 1. In addition, the above-described mechanisms are provided with controllers C for controlling their respective operations, and a control part B for integrally controlling the respective controllers C is also provided.

In this embodiment, a solder ball printing method using a film in place of the known metal mask is employed. In this method, after the film is attached on a substrate, openings are provided in the film at the locations corresponding to those of electrodes formed on the substrate. Subsequently, after the openings are loaded with solder balls and then filled with flux, the solder balls are heated and fused. Thereafter, the film is detached, and solder bumps are formed. The solder balls used in this embodiment are micro-balls having a diameter in the range of 10 μm to 70 μm. Here, the film having a thickness of about 30 μm is used for the solder balls having a diameter of about 25 μm. The thickness of the film is made slightly larger than the diameter of the solder balls, thereby leaving a flux filling space while reliably holding the solder balls in the openings.

Next, the procedure for forming solder bumps will be broadly described with reference to FIG. 1. Firstly, the film attachment mechanism 10 attaches a film 2 to an electrode forming surface side of the substrate 1 on which solder bumps are formed. The substrate 1 with the film 2 attached thereto is conveyed from the film attachment mechanism 10 to the exposure mechanism 11, and placed on a table, where the whole surface of the film 2 attached to the substrate 1 is exposed. Thereafter, the substrate 1 is conveyed to the developing mechanism 12 for developing the film 2 at the locations corresponding to those of electrodes 7 formed on the substrate 1.

The developing mechanism 12 develops the film 2 at the locations corresponding to those of the electrodes 7 on the substrate 1 by means of a laser beam, and the developed portions of the film 2 are removed to thereby form openings 3. And then the substrate 1 is cleaned. The openings 3 are formed by developing the film 2 attached to the substrate 1, at the locations corresponding to those of the electrodes 7, thereby preventing the openings 3 from being misaligned with the electrodes 7. Furthermore, the openings 3 can be set to an arbitrary size by controlling the time of exposure and the intensity of the laser beam. Subsequently, the substrate 1 is conveyed to the solder ball loading mechanism 13 and placed on a loading table with the surface to which the film 2 is attached facing up. A loading head for charging and loading solder balls (hereinafter also referred to as micro-balls) 4 is operated to load the micro-balls 4 located within the loading head and on a surface of a mask (to be described later) into the openings 3 provided in the film 2, so that the micro-balls 4 are placed on the electrodes 7 on the substrate 1.

When loading of the micro-balls 4 on the electrodes 7 is finished, a line sensor for checking a loading state is operated to check the loading state. If any unloaded opening is found, the loading head is allowed to operate again to perform the loading operation. Thereafter, checking of the loading state is carried out again. This process is repeated until all openings 3 are loaded with the micro-balls 4. Finally, when it is determined that all openings 3 are loaded with the micro-balls 4, the process of loading the micro-balls 4 is completed. Details of the loading process will be described later.

After the process of loading the micro-balls 4 is completed, a flux printing process is conducted by the flux printing mechanism 14. In the known art, this process is performed prior to the solder ball loading process. However, in the case where the micro-balls 4 of small size having a diameter of about 40 μm are loaded after printing a flux 5, when the micro-balls 4 are removed from the electrodes 7 with suction in order to repair, for example, misalignment of the micro-balls 4, it is difficult to detach the micro-balls 4 from the flux 5. Moreover, it is also extremely difficult to handle the micro-balls 4 of very small size having a diameter of about 40 μm, and a special jig is therefore necessary. For this reason, in this embodiment, the process of printing the flux 5 is performed after the micro-ball loading process.

In the flux printing process, firstly, the flux 5 is squeezed into the openings 3 by using a squeegee provided on a print head. At this time, by heating the flux 5 to increase liquidity thereof so as to reliably feed the flux 5 into the openings 3, and applying negative pressure while applying the flux 5, it is possible to reliably squeeze the flux 5, without bubbles, into the openings 3 loaded with the micro-balls 4. At this time it is to be note that too great negative pressure causes the micro-balls 4 to be sucked up. Therefore, the negative pressure is adjusted to prevent movement of the micro-balls 4. The structure of a squeegee head, or the like, will be described later. After the process of printing the flux 5, the line sensor checks that state. If it is determined that printing has been reliably performed, the substrate 1 is conveyed to the next reflow part 15.

The substrate 1 conveyed to the reflow part 15 is subjected to hot air, and the micro-balls 4 are melted and fused to thereby form solder bumps 6. When the formation of the solder bumps 6 is completed, the substrate 1 is conveyed to the film detachment mechanism 16, where after a solvent is sprayed on a surface of the substrate 1, dry air is blown thereon, and the film 2 is detached from the surface of the substrate 1. Thus, the substrate 1 with the solder bumps 6 formed on the electrodes 7 is formed. The above-described operations are controlled by the controllers C for controlling the operations of the respective mechanisms, and the control part B for integrally controlling the respective controllers C.

As described above, the process includes: attaching the film 2 to the surface of the substrate 1; forming, with the exposure mechanism 11 and the developing mechanism 12, the openings 3 in the film 2 at the locations corresponding to those of the electrodes 7 on the surface of the substrate 1; loading the micro-balls 4 into the openings 3; and after checking the loading state, printing the flux 5 through the openings 3. Thus, it is possible to prevent defect generation such as misalignment of the micro-balls 4.

FIG. 2 shows a sectional view of the micro-ball loading mechanism 13. The micro-ball loading mechanism 13 is provided with a substrate mounting portion 21 integrally provided on a loading table 20. The surfaces of the loading table 20 and the substrate mounting portion 21 are covered with a mask 22 so that the micro-balls 4 are easily loaded into the openings 3 of the film 2 formed in the surface of the substrate 1 and easily move when a dispersing coil squeegee 28s of a loading head 28 is moved by a predetermined pressing force. An attaching portion 23 of the mask 22 is made of a magnetic material and can be fixed by a magnet 24 provided on the loading table 20.

The loading table 20 is provided with an oscillating mechanism or a vibrating mechanism (not shown) for dispersing the micro-balls 4 on the mask 22. Also, while not shown in the figure, a lifting mechanism for vertical movement of the loading table 20 is provided on the loading table 20. Further, a negative pressure feeding port 33 for feeding negative pressure to retain the substrate 1 on a surface of the mask 22 is provided in the substrate mounting portion 21 and the mask 22, passing through the loading table 20. It is to be noted that the negative pressure feeding port 33 is connected to a vacuum pump (not shown). Moreover, a lifting pin 32 that is moved up and down by a driving mechanism (not shown) is provided for receiving the substrate 1 from a robot hand (not shown) or the like.

It is to be noted that the substrate mounting portion 21 is provided in a raised manner relative to the loading table 20. In other words, a step A is provided between the surface of the loading table 20 and the substrate mounting portion 21. The mask 22 in the step A is provided with plural holes 22a (each having a diameter of about 5 μm), and an air pipe 34 for introducing pressurized air to remove the micro-balls 4 from the periphery of the substrate mounting portion 21. It is to be noted that, while not shown in the figure, the air pipe 34 is connected to a pump for supplying compressed air. In this manner, by providing the step A between the substrate mounting portion 21 and the loading table 20, the micro-balls 4 remaining on the periphery of the substrate 1 can be eliminated and collected on the surface of the mask 22.

Furthermore, a printing cover 25 for covering the whole upper surface of the loading table 20 is provided above the loading table 20. A driving motor 26 and a ball screw 31 that allow the loading head 28, an inspection camera 29, and an air-spray nozzle 27 to move in an X-axis direction are provided within the printing cover 25, in a central portion thereof. The printing cover 25 can be opened and closed to allow loading and unloading of the substrate 1. The loading head 28 is composed of a storage portion for storing the micro-balls 4, a feeder for feeding the stored micro-balls 4, and the dispersing coil squeegee 28s for loading the fed micro-balls 4 into the openings 3 of the film 2. It is to be noted that a driving mechanism 37 for moving the line sensor 29 in a Y-axis direction is provided on an attaching portion 36 of the line sensor 29.

Further, the air-spray nozzle 27 is provided for removing the micro-balls 4 remaining on the surface of the film 2 by blowing air thereon through the nozzle 27, and provided with a rotating mechanism for allowing the tip of the air-spray nozzle 27 to rotate. Also, an ionizer 30 for eliminating static electricity of the micro-balls 4 is provided in the vicinity of an upper central portion of the printing cover 25. The ionizer 30 is oscillated by a driving mechanism (not shown) so as to allow irradiation of the whole surface of the loading table 20. Also, an exhaust port 35 is provided in the printing cover 25. The exhaust port 35 is connected to a pipe having a discharge pump (not shown). In particular, maintaining constant temperature in the printing cover 25 allows prevention of the adhesion between the micro-balls 4 caused due to the adhesion of water to the micro-balls 4.

The dispersing coil squeegee 28s with a wire rod formed into a coil is provided on a portion of the loading head 28 in contact with the surface of the film 2. The loading table 20 is lifted to press the loading head 28 against the surface of the film 2 with a predetermined pressure. Thereafter, the loading head 28 is moved in the X-axis direction by the driving motor 26 to press the micro-balls 4 into the openings 3 provided in the surface of the film 2. It is to be noted that, while not shown in the figure, a lifting mechanism for allowing vertical movement of the loading head 28 is also provided on the loading head 28.

The operation of the micro-ball loading mechanism 13 is controlled by the controller 13C. Hereinafter, the micro-ball loading operation will be described with reference to FIG. 2.

Firstly, the substrate 1 is mounted on the substrate mounting portion 21 by the robot hand. At this time, the mask 22 is previously installed in such a manner as to cover the upper surface of the loading table 20 and the substrate mounting portion 21. On the substrate mounting portion 21, the lifting pin 32 is set in such a manner as to protrude from a surface of the substrate mounting portion 21 (a surface of the mask 22) to receive the substrate 1 from the robot hand. The substrate 1 brought in by the robot hand is passed onto the lifting pin 32. Thereafter, the lifting pin 32 is lowered, and the substrate 1 is placed on the surface of the mask 22 on the substrate mounting portion 21. Subsequently, negative pressure is fed through the negative pressure feeding port 33 to fix the substrate 1 on the surface of the mask 22. After the fixing of the substrate 1 is completed, the ionizer 30 is driven for eliminating static electricity of the solder balls 4 on the surface of the mask 22. This is for the purpose of separating clusters of the solder balls 4 adhering to each other due to static electricity. When the removal of electricity is completed, the loading table 20 is lifted to press the dispersing coil squeegee 28s of the loading head 28 against the surface of the mask 22.

Then the driving motor 26 is driven to move the loading head 28 in the X-axis direction while feeding the micro-balls 4. When the loading head 28 reaches the raised substrate mounting portion 21, the lifting mechanism of the loading head 28 is driven, and the loading head 28 is controlled in such a manner that pressing force is prevented from becoming excessive and is kept constant while continuing to move to load the micro-balls 4 into the openings 3 of the film 2 provided in the surface of the substrate 1. After the loading process, the loading head 28 is temporarily retracted, and the inspection line sensor 29 is moved while checking whether the micro-balls 4 are normally loaded into the openings 3 of the film 2. As a result of checking, if any unloaded opening or the like is found, reloading is determined, and reloading and checking operations are repeated. On the other hand, if all openings 3 are loaded, it is determined that the loading has been completed.

After the completion of the loading operation, firstly, positive pressure air is blown out of the air pipe 34, and at the same time, the air-spray nozzle 27 is operated to thereby clean the micro-balls 4 on the surface of the film 2 and collect in one place the micro-balls 4 remaining on the surface of the mask 22. And then feeding of negative pressure into the negative pressure feeding port 33 for retaining the substrate 1 is stopped, and the lifting pin 32 is operated to lift the substrate 1 above the surface of the mask 22. The substrate 1 is moved from the loading mechanism 13 to the flux printing mechanism 14 by means of the robot hand.

Figure 3:
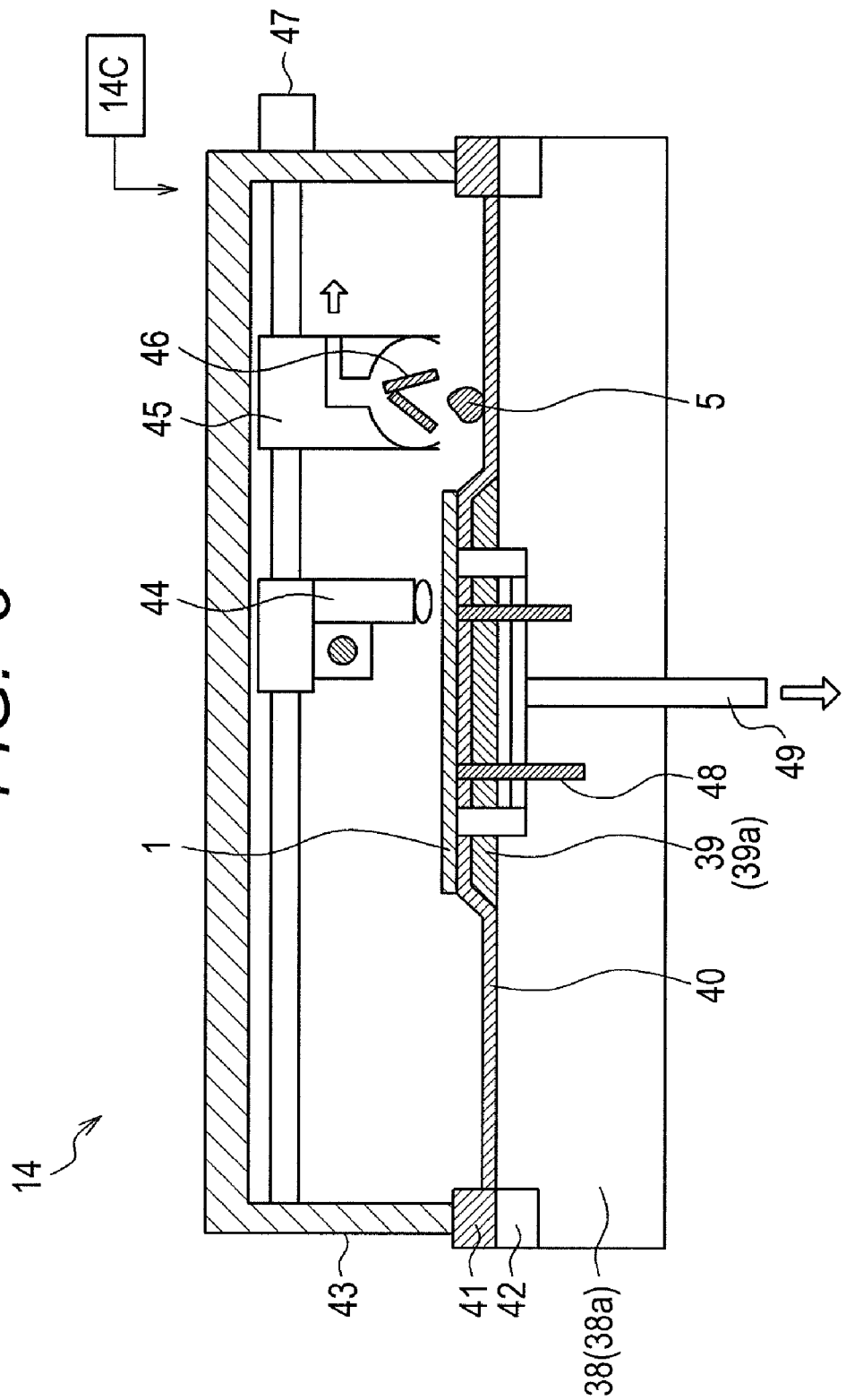
FIG. 3 shows the configuration of a flux printing mechanism according to one embodiment of the present invention.

FIG. 3 shows a sectional view of the flux printing mechanism 14. The flux printing mechanism 14 has a structure substantially similar to the micro-ball loading mechanism 13. More specifically, a flux printing table 38 and a substrate mounting portion 39 are provided on the flux printing mechanism 14. The flux printing table 38 is provided with a lifting mechanism (not shown) for allowing vertical movement of the flux printing table 38. A mask 40 is provided in such a manner as to cover the flux printing table 38 and the substrate mounting portion 39. The mask 40 is retained with a mask attaching portion 41 sticking to a magnet 42 provided on the flux printing table 38. A negative pressure feeding port 49 for sucking and retaining the substrate 1 is provided in the flux printing table 38, the substrate mounting portion 39, and the mask 40 for covering the substrate mounting portion 39 to allow them to communicate with each other. Moreover, a lifting pin 48 is provided for receiving and placing the substrate 1 on the substrate mounting portion 39.

A heater 39a for keeping the substrate 1 at a predetermined temperature is provided on the substrate mounting portion 39, for decreasing the viscosity of the flux 5 so as to allow easy entry of the flux 5 into the openings 3 and eliminate air intrusion. Furthermore, a flux printing cover 43 is provided above the flux printing table 38 in such a manner as to cover the whole surface of the flux printing table 38. A squeegee head 45 for printing the flux 5, a driving motor 47 and a ball screw 50 for moving an inspection line sensor 44 are provided within the flux printing cover 43. While not shown in the figure, the inspection line sensor 44 is also movable in the Y-axis direction in the same manner as FIG. 2.

Further, the squeegee head 45 is provided with a lifting mechanism (not shown) for allowing vertical movement of the squeegee head 45. Also, the squeegee head 45 has a closed squeegee structure for pressing the flux 5 therein, and is connected to a negative pressure pump (not shown) so as to form a negative pressure in the squeegee head 45.

The operation of the flux printing mechanism 14 configured in the above-described manner is controlled by the controller 14C. Hereinafter, the flux printing operation will be described with reference to FIG. 3.

Firstly, the lifting pin 48 is lifted above a surface of the mask 40 on the substrate mounting portion 39 so that the substrate 1 loaded with the micro-balls 4 is received on the substrate mounting portion 39 of the flux printing table 38. The substrate 1 brought in by the robot hand is passed onto the lifting pin 48. Thereafter, the robot hand is retracted, and the lifting pin 48 is lowered, thereby mounting the substrate 1 on the mask 40 on the substrate mounting portion 39. Subsequently, negative pressure is fed into the negative pressure feeding port 49, and the substrate 1 is retained on the surface of the mask 40 on the substrate mounting portion 39. The flux printing cover 43 is closed. At this time, the heater 39a provided on the flux printing table 38 is also operated to keep the surface of the substrate 1 at a constant temperature.

Subsequently, the flux printing table 38 is lifted to generate a predetermined pressing force at a squeegee 46 of the squeegee head 45. Further, the negative pressure pump is operated so as to form a negative pressure in the squeegee head 45. And then the driving motor 47 is driven to move the squeegee head 45 in the X-axis direction. When the squeegee head 45 reaches the substrate mounting portion 39, a difference in height, that is, a step exists between the substrate mounting portion 39 and the flux printing table 38. If the squeegee 46 is moved without changing the pressing force, therefore, the pressing force becomes excessive. For this reason, the lifting mechanism for vertically moving the squeegee head 45 is operated to lift the squeegee head 45 to the same level as the step so that the pressing force of the squeegee 46 is kept constant. In that state, the squeegee head 45 is moved in the X-axis direction to squeeze the flux 5 into the openings 3 of the film 2 provided on the surface of the substrate 1. At this time, there is a negative pressure in the squeegee head 45, thereby enabling prevention of residues of the flux 5 due to air intrusion into the flux 5.

After the process of printing the flux 5 by moving the squeegee head 45 on the surface of the substrate 1, the inspection line sensor 44 is operated to check a print state of the flux 5. As a result of checking, if the printing of the flux 5 is deficient, the print operation is restarted by allowing the squeegee head 45 to operate in the same manner again. On the other hand, if the flux 5 is sufficiently printed through all openings 3, the printing is completed. When the printing of the flux 5 is completed, feeding of negative pressure into the negative pressure feeding port 49 retaining the substrate 1 is stopped, and the lifting pin 48 is lifted to make the substrate 1 apart from the surface of the mask 40 so as to insert the robot hand between the substrate 1 and the mask 40. Thereafter, the flux printing cover 43 is opened, and the substrate 1 is received by the robot hand and conveyed to a reflow furnace. The above is the flux printing operation.

Figure 4:
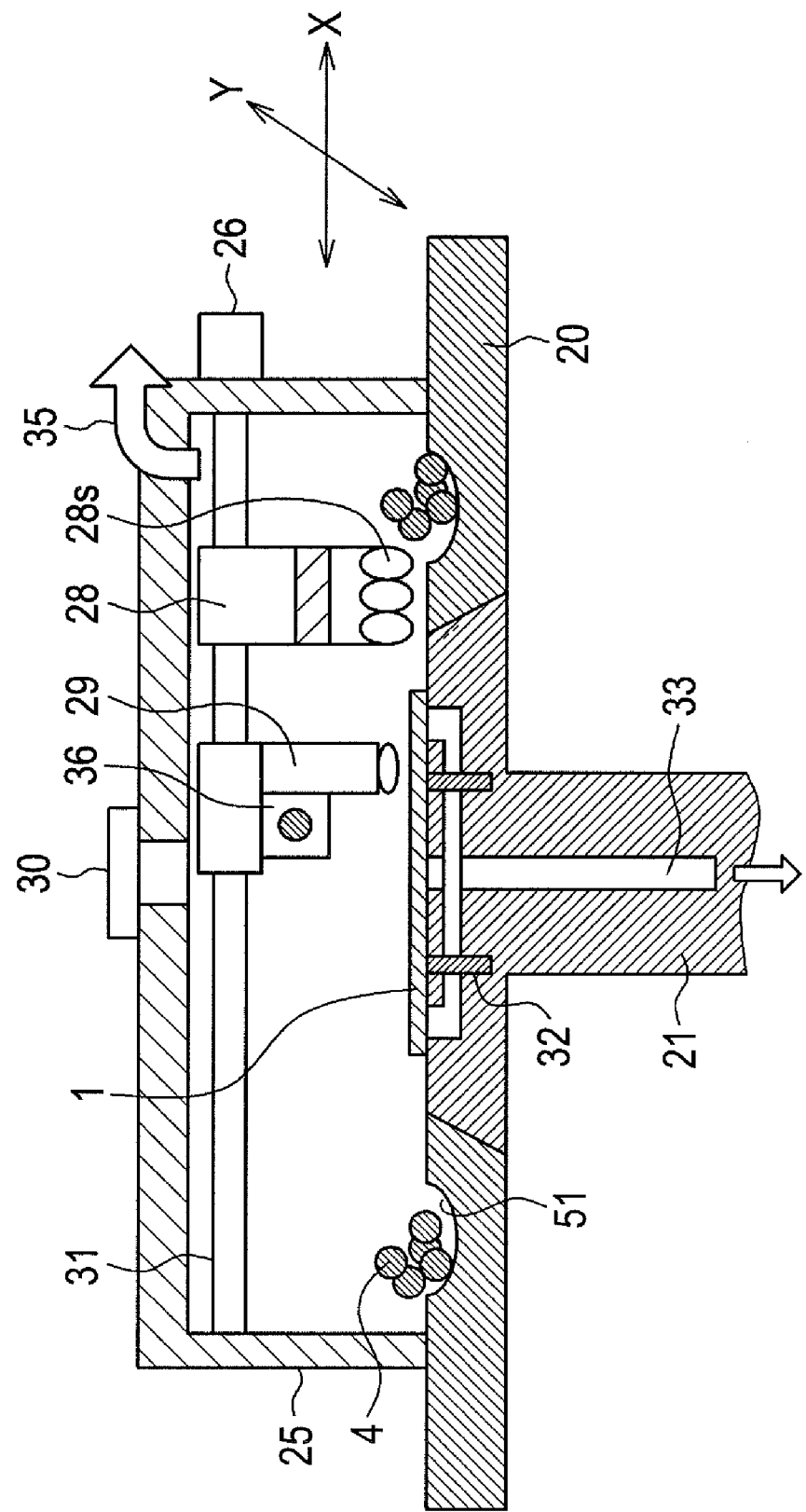
FIG. 4 shows the configuration of a solder ball loading mechanism according to another embodiment of the present invention.

Next, another embodiment of the micro-ball loading mechanism will be described with reference to FIG. 4. FIG. 4 has almost the same structure as those of FIG. 2, in which the same reference signs are used for the same components as those in FIG. 2. In FIG. 2, the loading table 20 and the substrate mounting portion 21 are almost integrally formed. However, in another embodiment shown in FIG. 4, those are provided as separate structures. More specifically, the substrate mounting portion (hereinafter also referred to as the substrate table) 21 is provided with a lifting mechanism for vertical movement. Further, in FIG. 2, the mask 22 is provided in such a manner as to cover the upper surfaces of the loading table 20 and the substrate mounting portion 21, however, in FIG. 4, the mask 22 is not provided. Furthermore, a ball receiving groove 51 for storing the micro-balls 4 is provided in the loading table 20. According to this structure, the loading table 20 does not vertically move, on the other hand, the substrate table 21 is vertically movable. It is to be noted that the loading table 20 is provided with an oscillating mechanism or a vibrating mechanism for oscillating the lifting mechanism and the loading table 20. Additionally, the loading table 20 and the substrate table 21 are provided with a horizontal movement mechanism movable in the X and Y directions.

It should be noted that, in FIG. 4, the air-spray nozzle 27 is not illustrated, however, can be provided as needed. Other structures are almost the same as those in FIG. 2. In this structure, the ball receiving groove 51 for storing the micro-balls 4 is provided in the loading table 20, thereby allowing collection of micro-balls 4 in the ball receiving groove 51 by oscillating or vibrating the loading table 20 and minimization of the occurrence of the excess micro-balls 4. The printing operation using this device is basically the same as that described in FIG. 2. This differs from FIG. 2 in two respects. First, after the substrate 1 is placed on the substrate table 21 and negative pressure is kept, the substrate table 21 is lifted. Second, after the loading of the solder balls 4, the loading table 20 is oscillated, thereby recovering and collecting the excess micro-balls 4 in the ball receiving groove 51.

As described above, in another embodiment of the present invention, the excess micro-balls 4 are efficiently collected so that those micro-balls 4 can be used for the next loading, thereby allowing a reduction in consumption of the micro-balls 4.

What is claimed is:

1. A micro-bump forming apparatus in which solder balls are loaded into openings of a film attached on a substrate, and heated to form solder bumps, the apparatus comprising:
    a film attachment mechanism that attaches the film on a surface of the substrate;
    exposure and developing mechanisms that provide the openings in the film on electrodes formed on the substrate;
    a solder ball loading mechanism that loads the solder balls into the openings, the solder ball loading mechanism including a solder ball loading head, and a sensor for checking a loading state;
    a flux printing mechanism that prints flux through the openings loaded with the solder balls;
    a reflow part that heats the solder balls to form the solder bumps;
    a film detachment mechanism that detaches the film from the surface of the substrate; and
    a controller that controls operations of the respective mechanisms;
    wherein the solder ball loading mechanism further includes: a loading table, a substrate mounting portion for mounting the substrate to be printed, the substrate mounting portion having a surface formed in a raised manner relative to that of the loading table, and a mask for covering the surfaces of the loading table and the substrate mounting portion, the solder ball loading head includes a dispersing squeegee, and the dispersing squeegee moves while being pressed on surfaces of the mask and the film attached on the surface of the substrate with a predetermined pressing force to thereby load the solder balls into the openings of the film,
    after the loading head loads the solder balls into the openings of the film, the controller of the solder ball loading mechanism allows the sensor to check the loading state of the solder balls, and
    the mask includes: a plurality of openings between the surfaces of the loading table and the substrate mounting portion, a feed pipe for feeding positive pressure, the feed pipe being connected to the plurality of openings, and, after the loading of the solder balls into the openings of film, the controller feeds positive pressure into the feed pipe to allow the solder balls remaining on the periphery of the substrate to move on the mask.

2. The micro-bump forming apparatus according to claim 1, further comprising a printing cover provided above the loading table, the printing cover covering the whole surfaces of the loading table and the substrate mounting portion, wherein the solder ball loading head, the sensor, and an air-spray nozzle are provided within the printing cover through a driving mechanism, the driving mechanism composed of a driving motor and a ball screw that allow the solder ball loading head, the sensor, and the air-spray nozzle to move horizontally, the printing cover with a ceiling portion having an exhaust port, the exhaust port connected to a discharge pump for maintaining a constant environmental condition in the printing cover.

3. The micro-bump forming apparatus according to claim 1, wherein the solder balls have a diameter in the range of about 20 µm to 70 µm.

4. The micro-bump forming apparatus according to claim 1, wherein the flux printing mechanism includes: a substrate mounting portion for mounting the substrate loaded with the solder balls, the substrate mounting portion having a heater; and a squeegee for printing flux on the substrate, and the controller of the flux printing mechanism controls the heater to keep the substrate at a constant temperature and allows the squeegee to move horizontally while pressing the squeegee against the substrate with a predetermined pressing force to thereby perform flux printing.

5. The micro-bump forming apparatus according to claim 1, wherein the loading table has a ball receiving groove, and, after the loading of the solder balls into the openings of the film, the loading table is oscillated to thereby collect the solder balls remaining on the loading table in the ball receiving groove.

6. The micro-bump forming apparatus according to claim 1, wherein the controller of the solder ball loading mechanism determines, based on the result of the check the loading state of the solder balls, whether or not to reload the solder balls.

7. A micro-bump forming apparatus in which solder balls are loaded into openings of a film attached on a substrate, and heated to form solder bumps, the apparatus comprising:
    a film attachment mechanism configured to attach the film on a surface of the substrate;
    exposure and developing mechanisms configured to provide the openings in the film on electrodes formed on the substrate;
    a solder ball loading mechanism configured to load the solder balls into the openings, the solder ball loading mechanism including:
        (1) a loading table,
        (2) a substrate mounting portion configured to mount the substrate to be printed, the substrate mounting portion having a surface formed in a raised manner relative to that of the loading table,
        (3) a mask configured to cover the surfaces of the loading table and the substrate mounting portion, wherein the mask includes:
            (a) a plurality of openings between the surfaces of the loading table and the substrate mounting portion, and
            (b) a feed pipe configured to feed positive pressure, the feed pipe connected to the plurality of openings of the mask, and,
            (c) a controller configured to feed positive pressure into the feed pipe to allow the solder balls remaining on the periphery of the substrate to move on the mask, after the loading of solder balls into openings of film, (4) a solder ball loading head, including a dispersing squeegee configured to move with a predetermined pressing force while pressed on surfaces of the mask and the film attached on the surface of the substrate, to thereby load the solder balls into the openings of the film, and (5) a sensor configured to check a loading state of the solder ball loading mechanism;

a flux printing mechanism configured to print flux through the openings loaded with the solder balls;

a reflow part configured to heat the solder balls to form the solder bumps;

a film detachment mechanism configured to detach the film from the surface of the substrate; and a controller configured to control operations of the respective mechanisms, including allowing the sensor to inspect the loading state of the solder balls after the solder ball loading head loads the solder balls into the openings of the film, and then determining, based on the result of the inspection of the loading state of the solder balls, whether or not to reload the solder balls.

8. The micro-bump forming apparatus according to claim 7, further comprising a printing cover provided above the loading table, the printing cover covering the whole surfaces of the loading table and the substrate mounting portion, wherein the solder ball loading head, the sensor, and an air-spray nozzle are provided within the printing cover through a driving mechanism, the driving mechanism composed of a driving motor and a ball screw configured to allow the solder ball loading head, the sensor, and the air-spray nozzle to move horizontally, the printing cover with a ceiling portion having an exhaust port, the exhaust port connected to a discharge pump configured to maintain a constant environmental condition in the printing cover.

9. The micro-bump forming apparatus according to claim 7, wherein the solder balls have a diameter in the range of about 20 μm to 70 μm.

10. The micro-bump forming apparatus according to claim 7, wherein the flux printing mechanism includes: a substrate mounting portion configured to mount the substrate loaded with the solder balls, the substrate mounting portion having a heater; and a squeegee configured to print flux on the substrate, and the controller of the flux printing mechanism controls the heater to keep the substrate at a constant temperature and allows the squeegee to move horizontally while pressing the squeegee against the substrate with a predetermined pressing force to thereby perform flux printing.

11. The micro-bump forming apparatus according to claim 7, wherein the loading table has a ball receiving groove, and, after the loading of the solder balls into the openings of the film, the loading table is oscillated to thereby collect the solder balls remaining on the loading table in the ball receiving groove.

* * * * *